US011195959B2

(12) United States Patent
Saliba et al.

(10) Patent No.: US 11,195,959 B2
(45) Date of Patent: Dec. 7, 2021

(54) MIXED CATION PEROVSKITE SOLID STATE SOLAR CELL AND FABRICATION THEREOF

(71) Applicants: Ecole Polytechnique Federale de Lausanne (EPFL), Lausanne (CH); Panasonic Corporation, Osaka (JP)

(72) Inventors: Michael Saliba, Fribourg (CH); Taisuke Matsui, Osaka (JP); Konrad Domanski, Winterthur (CH); Jiyoun Seo, Renens (CH); Shaik Mohammed Zakeeruddin, Bussigny-Lausanne (CH); Wolfgang Richard Tress, Lausanne (CH); Michael Graetzel, St-Sulpice (CH)

(73) Assignees: Ecole Polytechnique Federale de Lausanne (EPFL), Lausanne (CH); Panasonic Corporation, Osaka (JP)

( * ) Notice: Subject to any disclaimer, the term of this patent is extended or adjusted under 35 U.S.C. 154(b) by 0 days.

(21) Appl. No.: 16/317,957

(22) PCT Filed: Jul. 3, 2017

(86) PCT No.: PCT/IB2017/054008
§ 371 (c)(1),
(2) Date: Jan. 15, 2019

(87) PCT Pub. No.: WO2018/015831
PCT Pub. Date: Jan. 25, 2018

(65) Prior Publication Data
US 2019/0312155 A1 Oct. 10, 2019

(30) Foreign Application Priority Data
Jul. 21, 2016 (EP) .................................. 16180656

(51) Int. Cl.
*H01L 31/044* (2014.01)
*H01L 31/02* (2006.01)
(Continued)

(52) U.S. Cl.
CPC ........ *H01L 31/02008* (2013.01); *C07F 7/003* (2013.01); *H01L 31/022425* (2013.01);
(Continued)

(58) Field of Classification Search
CPC .................. H01L 31/00–078; Y02E 10/50–60
(Continued)

(56) References Cited

U.S. PATENT DOCUMENTS

2017/0243699 A1* 8/2017 Beaumont ............ H01G 9/2009
2018/0351123 A1* 12/2018 Saliba ................. H01L 51/4226
2019/0185495 A1* 6/2019 Cahen ................... C07F 7/2284

FOREIGN PATENT DOCUMENTS

WO 2013171517 A1 11/2013
WO 2016038338 A1 3/2016

OTHER PUBLICATIONS

International Search Report; European Patent Office; International Application No. PCT/IB2017/054008; dated Aug. 3, 2017; 3 pages.
(Continued)

*Primary Examiner* — Bach T Dinh
(74) *Attorney, Agent, or Firm* — Taft Stettinius & Hollister LLP

(57) ABSTRACT

A perovskite material including an organic-inorganic perovskite structure of formula (I), $A_nMX_3$ (I), n being the number of cation A and an integer >4, A being a monovalent cation selected from inorganic cations Ai and/or from organic cations Ao, M being a divalent metal cation or a combination thereof, X being a halide and/or pseudohalide anion or a combination thereof, wherein at least one cation A is selected from organic cations Ao, the inorganic cations
(Continued)

Ai are independently selected from Li$^+$, Na$^+$, K$^+$, Rb$^+$, Cs$^+$, or Tl$^+$ and the organic cations Ao are independently selected from ammonium (NH$_4^+$), methyl ammonium (MA) (CH$_3$NH$_3^+$), ethyl ammonium (CH$_3$CH$_2$NH$_3$)$^+$, formamidinium (FA) (CH(NH$_2$)$_2^+$), methylformamidinium (CH$_3$C(NH$_2$)$_2^+$), guanidium (C((NH$_2$)$_3^+$), tetramethylammonium ((CH$_3$)$_4$N$^+$), dimethylammonium ((CH$_3$)$_2$NH$_2^+$) or trimethylammonium ((CH$_3$)$_3$NH$^+$).

13 Claims, 7 Drawing Sheets

(51) Int. Cl.
| | | |
|---|---|---|
| *H01L 31/0224* | (2006.01) | |
| *H01L 31/06* | (2012.01) | |
| *H01L 51/42* | (2006.01) | |
| *H01L 51/50* | (2006.01) | |
| *H01L 51/00* | (2006.01) | |
| *C07F 7/00* | (2006.01) | |

(52) U.S. Cl.
CPC ............ *H01L 31/06* (2013.01); *H01L 51/005* (2013.01); *H01L 51/0032* (2013.01); *H01L 51/422* (2013.01); *H01L 51/5012* (2013.01); *H01L 51/4226* (2013.01); *Y02E 10/542* (2013.01); *Y02E 10/549* (2013.01)

(58) Field of Classification Search
USPC .................................................. 136/243–265
See application file for complete search history.

(56) References Cited

OTHER PUBLICATIONS

Written Opinion of the International Searching Authority; European Patent Office; International Application No. PCT/B2017/054008; dated Aug. 3, 2017; 6 pages.

M. Loukil et al., Investigation of Ammonium Substitution in the Perovskite-Like Structure Rb0.79(NG4)0.21CdCl3, Journal of Molecular Structure, 2010, 977, 4 pages, Copyright 2010 Elsevier B.V.

Osvald Knop et al., Infrared Spectr of the Ammonium Ion in Crystals. Part XIV. Hydrogen Bonding and Orientation of the Ammonium Ion in Fluorides, with Observations on the Transition Temperatures in Cubic Cryolite, Slpasolite, and Perovskite Halides, Can. J. Chern., 1985, vol. 63, 26 pages.

\* cited by examiner

MIXED CATION PEROVSKITE SOLID STATE SOLAR CELL AND FABRICATION THEREOF

CROSS REFERENCE TO RELATED APPLICATIONS

This application is a U.S. national stage filing of International Patent Application No. PCT/IB2017/054008 filed Jul. 3, 2017, which claims priority to European Patent Application No. 16180656.7 filed Jul. 21, 2016, the contents of each application hereby incorporated by reference in their entirety.

Technical Field

The present invention relates to a perovskite material comprising a mixed cations organic-inorganic perovskite in particular a mixed cations organic-inorganic halide perovskite having at least four cations, to an optoelectronic and/or photoelectrochemical device, to a photovoltaic device, in particular to a solar cell or a solid state solar cell comprising a mixed cations organic-inorganic perovskite, and to a method of preparing said perovskite material and a method of preparing said photovoltaic device or said solar cell.

Technical Background and the Problem Underlying the Invention

Perovskite solar cells have emerged in recent years as possible candidates for low-cost and high-efficiency photovoltaics (PV). One class of photovoltaic materials, which attracted significant interest, is halide perovskites, in particular organic-inorganic halide perovskites.

The organic-inorganic halide perovskites used for photovoltaics have the general structure of $AMX_3$, which comprises monovalent cations $A=(Cs^+$, methylammonium (MA), formamidinium (FA)), a divalent metal $M=(Pb^{2+})$, and an anion $X=(Br^-; I^-)$.

Pure FA perovskites can crystallize as a phototinactive orthorhombic or hexagonal δ-phase (also known as "yellow phase"). This type of crystal is thermodynamically stable but photo inactive at room temperature. Pure FA perovskites can also crystallize as a photoactive perovskite α-phase ("black phase"). The induction of the crystallization of Fa perovskite towards the black phase crystallization has been improved by mixing further cations to the pure perovskite.

Accordingly, it was shown that a small amount of MA is sufficient to induce a preferable crystallization of FA perovskite into the black phase. The slightly smaller MA cation is considered as a "crystallizer" (or stabilizer) for the black phase of FA perovskite. MA has been the most studied cations to suppress the yellow phase formation of FA crystallization. The highest efficiency of a perovskite solar cell being 21.0% has been obtained with an organic-inorganic perovskite, wherein the organic cation is a mixture of a methylammonium (MA) ($CH_3NH_3^+$) and formamidinium (FA) ($CH(NH_2)_2^+$).

Recently, it has been demonstrated that the induction of a preferable crystallization of FA may be also obtained, when cesium (Cs) was used in combination with FA.

Pure perovskite compounds, $MAPbX_3$, $FAPbX_3$ and $CsPbX_3$ (X=Br or I), have numerous disadvantages such as structural phase transitions of the crystal at 55° C., degradation on contact with moisture, thermal instability, as well as light-induced trap-state formation, inappropriate band-gap for photovoltaic devices (PV) resulting in a lower solar light harvesting efficiency and halide anion segregation, when X consists of a mixture of halides. All disadvantages lower the device efficiency.

Thus using perovskites with mixed cations and halides has become more significant. Most recent advances focus on optimization of the development of well-known compounds. Recent works focus their efforts towards identifying elements to integrate in pure perovskite compounds but with moderate success. This is due to the fact that almost all elements have multiple oxidation states imposing fundamental stability concerns on maintaining the perovskite structure.

The present invention addresses disadvantages concerning the pure organic-inorganic perovskites: sensibility to variations during the fabrication process (i.e. during the temperature conditions: heat treatment, solvent exposure, humidity, etc. . . . ) resulting in the decrease of the quality of the thin film of perovskite, in the obtaining of mixed crystals in alpha and delta phases, of thermal and structural instabilities, of higher band gap than or band gap distant from 1.34 eV, low emissivity and low luminescence. Band gaps are between 400-800 nm and are comprised between 3-1.54 eV.

The present invention addresses disadvantages of photovoltaic devices comprising organic-inorganic perovskites such as low open circuit voltage (Voc), thermal instability, high loss of efficiency in full illumination under the long-term (aging problem), and low light sensitivity.

SUMMARY OF THE INVENTION

The invention seeks to provide an efficient photovoltaic device, in particular a solid stale solar cell that can be prepared rapidly in an efficient way, using readily available, low-cost materials, using a short manufacturing procedure based on industrially known manufacturing steps.

Surprisingly the inventors found that monovalent alkali metals such as Li, Na, K, Rb, Cs, which are usually too small (excepted Cs) to maintain a stable, photoactive perovskite alpha phase at room temperature, can be introduced as cation into the organic-inorganic perovskite structure to stabilize said structure into the photoactive black phase. They also stabilize mixed halides in the organic-inorganic halide perovskites by avoiding the segregation of the species of mixed halides. Said organic-inorganic perovskite has a combination of at least four mixed organic-inorganic cations and present unprecedented material properties: superior efficiency, reproducibility and crystal phase stability, thermal and hygroscopic stabilities and in the long term, maximum power point tracking.

Remarkably, the present inventors provide optoelectronic and/or photovoltaic devices, in particular a solid state solar cell or a photovoltaic device, comprising a film with a high purity of organic-inorganic halide perovskite having at least four combined cations. Thin films made by such organic-inorganic perovskites provide remarkable stabilized efficiency up to 21.6% to photovoltaic devices comprising such organic-inorganic halide perovskites with an open circuit voltage (Voc) of 1.24 V (being the highest Voc ever reported up to now on almost any photovoltaic material) with a band gap of 1.63 eV (the loss-in-potential, being the difference between the band gap and the Voc, is among the lowest, if not the lowest, ever measured for any photovoltaic material) and high electroluminescence. Further such organic-inorganic halide perovskites having at least four mixed cations degrade by a mere 5% after 500 hours of full illumination and heat at 85° C. and maximum power point tracking.

In an aspect, the present invention provides a perovskite material comprising an organic-inorganic perovskite structure of formula (I)

$$A_nMX_3 \quad (I).$$

wherein
n is number of cation A and is an integer ≥4.
A is a monovalent cation selected from inorganic cations Ai and/or from organic cations Ao, wherein
the inorganic cations Ai are independently selected from $Li^+$, $Na^+$, $K^+$, $Rb^+$, $Cs^+$, or $Tl^+$, and
the organic cations Ao are independently selected from ammonium ($NH_4^+$), methyl ammonium (MA) ($CH_3NH_3^+$), ethyl ammonium ($CH_3CH_2NH_3$)$^+$, formamidinium (FA) ($CH(NH_2)_2^+$), methylformamidinium ($CH_3C(NH_2)_2^+$), guanidium ($C((NH)_2)_3^+$), tetramethylammonium (($CH_3)_4N^+$), dimethylammonium (($CH_3)_2NH_2^+$) or trimethylammonium (($CH_3)_3NH^+$),
M is selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, $Yb^{2+}$ or a combination thereof.
X is an anion independently selected from $Br^-$, $I^-$, $Cl^-$, $SCN^-$, $CN^-$, $NC^-$, $OCN^-$, $NCO^-$, $NCS^-$, $SeCN^-$, $TeCN^-$, $PF_6^-$, $BF_4^-$ or a combination thereof, and
wherein at least one cation A is selected from organic cations Ao.

In a further aspect, the present invention provides an optoelectronic and/or photoelectrochemical device comprising a perovskite material of the invention comprising a perovskite structure of formula (I).

In another aspect, the invention provides a method of preparing a perovskite material of the invention comprising an organic-inorganic perovskite structure of formula (I) comprising:
providing a perovskite precursor composition in anhydrous solution; comprising at least;
providing at least two halide and or pseudohalide salts of inorganic cations Ai in anhydrous solution, said inorganic cation Ai being selected from $Li^+$, $Na^+$, $K^+$, $Rb^+$, $Cs^+$, or $Tl^+$, wherein the halide and/or pseudohalide anion of the halide and/or pseudohalide salt is selected from iodide, chloride and bromide, $SCN^-$, $CN^-$, $NC^-$, $OCN^-$, $NCO^-$, $NCS^-$, $SeCN^-$, $TeCN^-$, $PF_6^-$, $BF_4^-$ or a combination thereof;
adding the anhydrous solution of said at leant two halide and/or pseudohalide salts of inorganic cations Ai to the perovskite precursor composition in anhydrous solution, and mixing at room temperature; characterized in that the perovskite precursor composition comprises at least one halide and/or pseudohalide salt of an organic cation Ao and at least one halide and/or pseudohalide salt of metal M, said organic cation Ao being selected from ammonium ($NH_4^+$), methyl ammonium (MA) ($CH_3NH_3^+$), ethyl ammonium ($CH_3CH_2NH_3$)$^+$, formamidinium (FA) ($CH(NH_2)_2^+$), methylformamidinium ($CH_3C(NH_2)_2^+$), guanidium ($C((NH)_2)_3^+$), tetramethylammonium (($CH_3)_4N^+$), dimethylammonium (($CH_3)_2 NH_2^+$) or trimethylammonium (($CH_3)_3NH^+$), and said metal M being selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, $Yb^{2+}$ or a combination thereof, the halide and/or pseudohalide anion of said salts is independently selected from iodide, chloride, bromide, $SCN^-$, $CN^-$, $NC^-$, $OCN^-$, $NCO^-$, $NCS^-$, $SeCN^-$, $TeCN^-$, $PF_6^-$, $BF_4^-$ or a combination thereof; and
in that each halide and or pseudohalide salt of said at least two halide and/or pseudohalide salts of inorganic cations Ai is dissolved in an anhydrous solution at room temperature.

Further aspects and preferred embodiments of the invention are defined herein below and in the appended claims. Further features and advantages of the invention will become apparent to the skilled person from the description of the preferred embodiments given below.

DETAILED DESCRIPTION OF THE PREFERRED EMBODIMENTS

Figure 1:
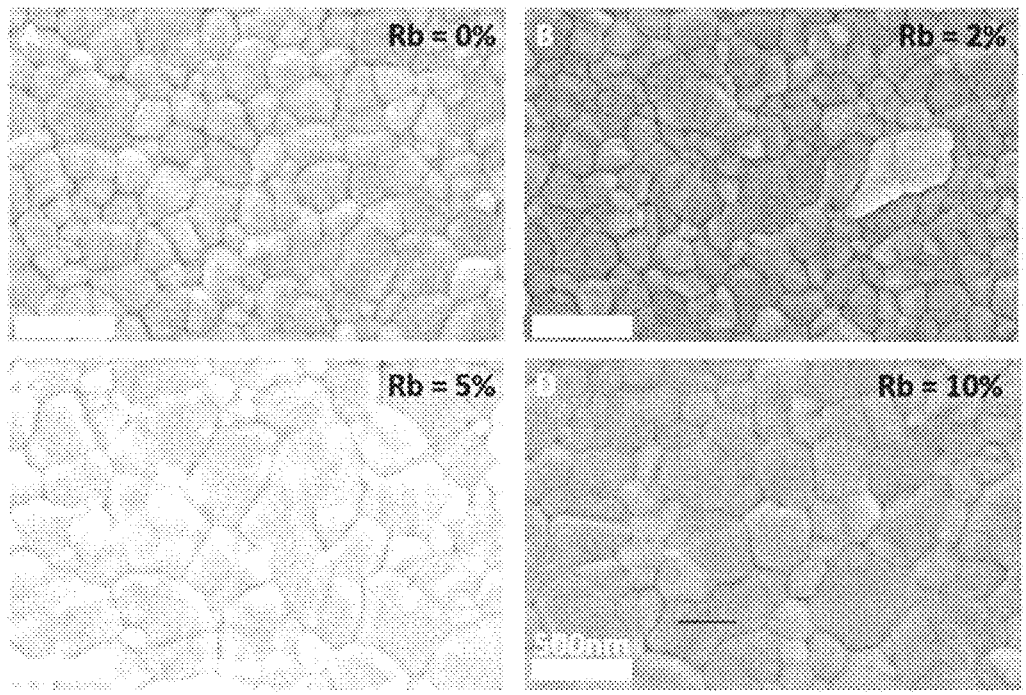
FIG. 1 shows SEM pictures of thin films of organic-inorganic perovskites having A: three organic-inorganic cations $(CS_a(MA_gFA_h)_{(1-a)}Pb(I_{0.83}Br_{0.17})_3)$ (CsMAFA), B, C and D: four organic-inorganic cations $(Rb_bCs_g(MA_g FA_h)_{(1-a-b)}Pb(I_{0.83}B_{0.17})_3)$ (RbCsMAFA), wherein cation Rb* is present at 2% (B), 5% (C) and 10% (D) compare to Cs counterpart.

The present invention provides a perovskite material comprising an organic-inorganic perovskite structure of formula (I)

$$A_n MX_3 \qquad (I),$$

wherein
- n is number of cation A and is an integer ≥4,
- A is a monovalent cation selected from inorganic cations Ai and from organic cations Ao, wherein
  - the inorganic cations Ai are independently selected from $Li^+$, $Na^+$, $K^+$, $Rb^+$, $Cs^+$, or $Tl^+$, and
  - the organic cations Ao are independently selected from ammonium ($NH_4^+$), methyl ammonium (MA) ($CH_3NH_3^+$), ethyl ammonium ($CH_3CH_2NH_3$)$^+$, formamidinium (FA) ($CH(NH_2)_2^+$), methylformamidinium ($CH_3C(NH_2)_2^+$), guanidium ($C((NH_2)_2)_3^+$), tetramethylammonnium (($CH_3)_4N^+$), dimethylammonium (($CH_3)_2NH_2^+$) or trimethylammonium (($CH_3)_3NH^+$),
- M is selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, $Yb^{2+}$ or a combination thereof,
- X is an anion independently selected from $Br^-$, $I^-$, $Cl^-$, $SCN^-$, $CN^-$, $NC^-$, $OCN^-$, $NCO^-$, $NCS^-$, $SeCN^-$, $TeCN^-$, $PF_6^-$, $BF_4^-$ or a combination thereof, and
- wherein at least one cation A is selected from organic cations Ao.

Preferably said at least one cation A being selected from organic cations Ao is FA.

In one embodiment, the number of cations A in the perovskite structure of formula (I) being n is an integer selected from 4 to 7, n may be 4, 5, 6, or 7. Accordingly, at least two cations A are different from each other. Preferably, all cations, when n≥4 cations are different from each other. Accordingly, $A_1, A_2, A_3, \ldots, A_n$ cations, n being an integer selected from 4 to 7, are different from each other.

A is a monovalent cation selected from inorganic cations Ai and/or from organic cations Ao. At least one cation A is selected from organic cations Ao and/or at least one cation A is selected from inorganic cation Ai. Preferably, at least one cation A is selected from organic cations Ao and one or more cations A are selected from inorganic cation Ai. Preferably two cations A are selected from organic cations Ao, and (n−2) cations A are selected from inorganic cation Ai.

If n is 4, the organic-inorganic perovskite structure of formula (I) $A_{(1)}, \ldots, A_{(4)}MX_3$ may be selected from formula (Ia) or (Ib)

$$Ai_1 Ai_2 Ai_3 Ao_4 MX_3 \qquad (Ia)$$

$$Ai_1 Ai_2 Ao_3 Ao_4 MX_3 \qquad (Ib).$$

If n is 5, the organic-inorganic perovskite structure of formula (I) $A_{(1)}, \ldots, A_{(5)}MX_3$ may be selected from formula (Ic) or (Id)

$$Ai_1 Ai_2 Ai_3 Ai_4 Ao_5 MX_3 \qquad (Ic)$$

$$Ai_1 Ai_2 Ai_3 Ao_4 Ao_5 MX_3 \qquad (Id).$$

If n is 6, the organic-inorganic perovskite structure of formula (I) $A_{(1)}, \ldots, A_{(6)}MX_3$ may be selected from formula (Ie) or (If)

$$Ai_1 Ai_2 Ai_3 Ai_4 Ai_5 Ao_6 MX_3 \qquad (Ie)$$

$$Ai_1 Ai_2 Ai_3 Ai_4 Ao_5 Ao_6 MX_3 \qquad (If).$$

If n is 7, the organic-inorganic perovskite structure of formula (I) $A_{(1)}, \ldots, A_{(7)}MX_3$ may be selected from formula (Ig) or (Ih)

$$Ai_1 Ai_2 Ai_3 Ai_4 Ai_5 Ai_6 Ao_7 MX_3 \qquad (Ig)$$

$$Ai_1 Ai_2 Ai_3 Ai_4 Ai_5 Ao_6 Ao_7 MX_3 \qquad (Ih),$$

Ai is an inorganic cation and Ao is an organic cation as defined herein.

M is a metal cation as defined herein and X is an halide anion as defined herein.

Accordingly, the perovskite material may comprise an organic-inorganic perovskite structure according to any one of formulae (Ia), (Ib), (Ic), (Id), (Ie), (If), (Ig), and (Ih).

Said inorganic cations Ai are independently selected from $Li^+$, $Na^+$, $K^+$, $Rb^+$, $Cs^+$, or $Tl^+$. In particular, said inorganic cations Ai are independently selected from $Na^+$, $K^+$, $Rb^+$, $Cs^+$, or $Tl^+$, preferably $Na^+$, $K^+$, $Rb^+$, $Cs^+$ or $Rb^+$, $Cs^+$, $Tl^+$. If n is 4, Ai may be selected from $Na^+$, $K^+$, $Rb^+$, $Cs^+$, preferably $Rb^+$, $Cs^+$.

According to a further embodiment, at least one cation A is an inorganic cation Ai selected from $Rb^+$ or $Cs^+$.

According to another embodiment, at least two cations A are inorganic cations Ai being $Rb^+$ and $Cs^+$.

Said organic cations Ao are independently selected from ammonium ($NH_4$), methyl ammonium (MA) ($CH_3NH_3^+$), ethyl ammonium ($CH_3CH_2NH_3$)$^+$, formamidinium (FA) ($CH(NH_2)_2^+$), methylformamidinium ($CH_3C(NH_2)_2^+$), guanidium ($C((NH_2)_2)_3^+$), tetramethylammonium (($CH_3)_4N^+$), dimethylammonium (($CH_3)_2NH_2^+$) or trimethylammonium (($CH_3)_3NH^+$), preferably from methyl ammonium (MA) ($CH_3NH_3^+$), formamidinium (FA) ($CH(NH_2)_2^+$), methylformamidinium ($CH_3C(NH_2)_2^+$), dimethylammonium (($CH_3)_2NH_2^+$) or trimethylammonium (($CH_3)_3NH^+$), most preferably from methyl ammonium (MA) ($CH_3NH_3^+$), formamidinium (FA) ($CH(NH_2)_2^+$). Said organic cations Ao may be provided under a combination of at least two above-mentioned organic cations, preferably under a combination of organic cations Ao being formamidinium (FA) or methylammonium (MA).

In a further embodiment, at least one cation A being selected from organic cation Ao is selected from formamidinium (FA) or methylammonium (MA).

In another embodiment, one cation A is the organic cation Ao being formamidinium (FA) and a second cation A is the organic cation Ao being methylammonium (MA).

M is a divalent metal cation selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, $Yb^{2+}$ or a combination thereof. Preferably M is selected from $Ge^{2+}$, $Sn^{2+}$ or $Pb^{2+}$ or a combination thereof, most preferably from $Sn^{2+}$, $Pb^{2+}$ or a combination of at least two aforementioned divalent metal cations. A preferred combination of divalent metal cations M is $Sn_{(1.00-y)}Pb_y$, y being the ratio of $Pb^{2+}$ in the mixed metal cations M, $0.00 < y < 1.00$.

In a further embodiment, $X_2$ represents X'X"X'", wherein X', X" and X'" are independently selected from $Br^-$, $I^-$, $Cl^-$, $SCN^-$, $CN^-$, $NC^-$, $OCN^-$, $NCO^-$, $NCS^-$, $SeCN^-$, $TeCN^-$, $PF_6^-$, $BF_4^-$, where X', X" and X'" are different from each other or identical to each other, or wherein one of X', X" and X'" is different from the two others being identical. Accordingly, $X_3$ may be selected from $Br_3^-$, $I_3^-$, $Cl_3^-$, $SCN^-$, $CN^-$, $NC^-$, $OCN^-$, $NCO^-$, $NCS^-$, $SeCN^-$, $TeCN^-$, $PF_6^-$, $BF_4^-$ and from a combination of halide and/or pseudohalide anions consisting of $(I_{(3-m)}Cl_m)^-$, $(I_{(3-m)}Br_m)^-$, $(Br_{(3-m)}Cl_m)^-$, $(Cl_{(3-m)}I_m)^-$, $(Br_{(3-m)}I_m)^-$, $(I_{(3-m)}SCN_m)^-$, $(I_{(3-m)}(BF_4)_m)$, and $(I_{(3-m)}(PF_6)_m)$, wherein $0.00<m<3.00$. Said combinations of halide and/or pseudohalide anions may also be articulated as ratios between the halide and/or pseudohalide elements. Accordingly, X may be selected from of $Br^-$, $I^-$, $Cl^-$, $SCN^-$, $CN^-$, $NC^-$, $OCN^-$, $NCO^-$, $NCS^-$, $SeCN^-$, $TeCN^-$, $PF_6^-$, $BF_4^-$, and from a combination of halide and/or pseudohalide anions consisting of $(I_{(1.00-z)}Cl_2)^-$, $(I_{(1.00-u)}Br_u)^-$, $(Br_{(1.00-v)}Cl_v)^-$, $(Cl_{(1.00-w)}I_w)^-$, or $(Br_{(1.00-x)}I_x)^-$, $(I_{(1.00-p)}SCN_p)^-$, $(I_{(1.00-q)}(BF_4)_q)^-$, and $(I_{(1.00-r)}(PF_6)_r)^-$, wherein z, u, v, w, x, p, q, and r are ratios of the respective halide and/or pseudohalide anion in the combination, and $0.00<z, u, v, w, x, p, q, r<1.00$ According to another embodiment, the perovskite material of the invention comprises an organic-inorganic perovskite structure of formula (I) being selected from an organic-inorganic perovskite structure of formula (II),

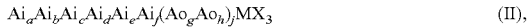

$$Ai_aAi_bAi_cAi_dAi_eAi_f(Ao_gAo_h)_jMX_3 \quad (II),$$

wherein
  a, b, c, d, e, f are ratios of inorganic cations Ai, and g and h are ratios of organic cation Ao,
  j is the ratio of organic cations $Ao_gAo_h$,
  a, b, c, d, e, f are $\geq 0.00$ and $<1.00$, and $0.00<(a+b+c+d+e+f)<1.00$,
  $h=1.00-g$, and $0.00<g\leq 1.00$,
  $j=1.00-(a+b+c+d+e+f)$, and $0.00<j<1.00$, and
  Ai is an inorganic cation and Ao is an organic cation as defined herein, and
  M is a divalent metal cation and X is a halide and/or pseudohalide anion as defined herein;
with the proviso
  that 3, 4, 5, or 6 inorganic cations Ai being selected from $Ai_aAi_bAi_cAi_dAi_e$ or $Ai_f$ have a ratio a, b, c, d, e or f being $>0.00$ if h is 0.00, and
  that 2, 3, 4, or 5 inorganic cations Ai being selected from $Ai_aAi_bAi_cAi_dAi_e$ or $Ai_f$ have a ratio a, b, c, d, e or f being $>0.00$, if h is $>0.00$.

According to an embodiment, one of the organic cations $Ao_g$ or $Ao_h$ is methylammonium and the other organic cation is formamidinium. Accordingly, g is $>0.00$ and $\leq 1.00$. If g is 1.00, h is 0.00 and $Ao_h$ is absent. Preferably, if g is 1.00, the organic cation is $Ao_g$ is formamidinium (FA).

In a further embodiment, if h is 0.00, at least three inorganic cations Ai selected from $Ai_aAi_b Ai_cAi_dAi_e$ or $Ai_f$ of the organic-inorganic perovskite of formula (II) have a ratio a, b, c, d, e or f being $>0.00$. Accordingly at least three ratios selected from a, b, c, d, e and f are $>0.00$ and at least three inorganic selected from $Ai_a$ $Ai_b$ $Ai_c$ $Ai_d$ $Ai_e$ or $Ai_f$ are present in the perovskite material. In particular, 3, 4, 5, Or 6 inorganic cations Ai being selected from $Ai_a$ $Ai_bAi_cAi_dAi_e$ or $Ai_f$ have a ratio a, b, c, d, e or f being $>0.00$.

In a further embodiment, if h is $>0.00$, at least two inorganic cations Ai selected from $Ai_a$ $Ai_bAi_cAi_dAi_e$ or $Ai_f$ of the organic-inorganic perovskite of formula (II) have a ratio a, b, c, d, e or f being $>0.00$. Accordingly at least two ratios selected from a, b, c, d, e and f are $>0.00$ and at least two inorganic cations Ai being selected from $Ai_aAi_bAi_cAi_d$-$Ai_e$ or $Ai_f$ are present in the perovskite material. In particular, 2, 3, 4 or 5 inorganic cations Ai being selected from $Ai_aAi_bAi_cAi_dAi_e$ or $Ai_f$ have a ratio a, b, c, d, e or f being $>0.00$.

According to an embodiment, one inorganic cation Ai being selected from $Ai_aAi_bAi_cAi_dAi_e$ or $Ai_f$ having a ratio a, b, c, d, e or f being $>0.00$ is $Rb^{2+}$ or $Cs^{2+}$. In particular, one inorganic cations Ai being selected from $Ai_aAi_bAi_cAi_dAi_e$ or $Ai_f$ having a ratio a, b, c, d, e or f being $>0.00$ is $Rb^{2+}$ and one further inorganic cation Ai being selected from $Ai_aAi_bAi_cAi_dAi_e$ or $Ai_f$ having a ratio a, b, c, d, e or f being $>0.00$ is $Cs^{2+}$.

The invention also provides a method of preparing a perovskite material of the invention comprising a perovskite structure of formula (I) as defined herein comprising:
  providing a perovskite precursor composition in anhydrous solution;
  providing at least two halide and/or pseudohalide salts of inorganic cations Ai as defined herein in anhydrous solutions, the halide and/or pseudohalide anion of the halide and/or pseudohalide salt being independently selected from iodide, chloride and bromide, $SCN^-$, $CN^-$, $NC^-$, $OCN^-$, $NCO^-$, $NCS^-$, $SeCN^-$, $TeCN^-$, $PF_6^-$, $BF_4^-$ or a combination thereof;
  adding the anhydrous solutions of said least two halide and/or pseudohalide salts of inorganic cations Ai to the perovskite precursor composition, and mixing at room temperature;
  characterized in that the perovskite precursor composition comprises at least one halide and/or pseudohalide salt of an organic cation Ao and at least one halide and/or pseudohalide salt of metal M, the organic cation Ao and the metal M being as defined herein and the halide and/or pseudohalide anions of said salts are independently selected from iodide, chloride and bromide, $SCN^-$, $CN^-$, $NC^-$, $OCN^-$, $NCO^-$, $NCS^-$, $SeCN^-$, $TeCN^-$, $PF_6^-$, $BF_4^-$ or a combination thereof and
  in that each halide and/or pseudohalide salt of said at least two halide and/or pseudohalide salts of inorganic cations Ai is dissolved in an anhydrous solution at room temperature.

Relative to the step of providing at least two halide and/or pseudohalide salts of inorganic cations Ai in anhydrous solution, more than two halide and/or pseudohalide salts of inorganic cations Ai in anhydrous solutions may be provided. It may be provided as many halide and/or pseudohalide salts of inorganic cations Ai in anhydrous solution as it is needed to form an organic-inorganic perovskite structure of formula (I) with $4\leq n\leq 7$, all halide and/or pseudohalide salts of inorganic cation Ai being dissolved in anhydrous solution at room temperature.

The anhydrous solution is solvent being selected from DMSO, DMF or GBL.

To prepare thin film of perovskite material of the invention for an optoelectronic and/or photoelectrochemical device, said thin film are prepared in situ by spin-coating, drop casting, dip-coating or spray-coating, preferably by spin-coating the perovskite material solution obtained by the method of the preparation as defined above on the mesoporous metal oxide substrate. Said step of spin-coating may be provided in one or two steps. After the application of the perovskite material in solution, the thin film is annealed.

The invention also provides an optoelectronic and/or photoelectrochemical device comprising a perovskite material of the invention as defined above or herein. The perovskite material of the invention comprises an organic-inorganic perovskite structure of formula (I), which may be selected from an organic-inorganic perovskite structure according to any one of formulae (Ia), (Ib), (Ic), (Id), (Ie), (If), (Ig), and (Ih) or may be selected from an organic-inorganic perovskite structure according to formula (II).

According to an embodiment the optoelectronic and/or photoelectrochemical device of the invention is selected from a photovoltaic device being selected from an organic solar cell, a solid state solar cell, from a p-n heterojunction, a phototransistor or OLED (organic light-emitting diode).

The present solid slate photovoltaic device being a solar cell preferably comprises a conductive support and/or charge collector, a scaffold structure; an optional protective layer; one or more perovskite layers, an optional hole conductor layer, an optional protective layer, and a counter electrode and/or a metal layer.

According to a further embodiment, the optoelectronic and/or photoelectrochemical device of the invention is a solid-state solar cell comprising a conductive support layer covered by a surface-increasing scaffold structure, one or more organic-inorganic perovskite layers comprising said perovskite material of the invention as defined herein, and a counter electrode and/or metal layer. Said one or more organic-inorganic perovskite layers are preferably provided on the surface-increasing scaffold structure.

The solid-slate solar cell may further comprise protective layers and/or hole transport layers.

According to an embodiment, the conductive support layer provides the support layer of the solar cell of the invention. The solar cell is built on said support layer. According to another embodiment, the support of the solar cell is provided on the side of the counter electrode. In this case, the conductive support layer does not necessarily provide the support of the device, but may simply be or comprise a current collector, for example a metal foil.

The conductive support layer preferably functions and/or comprises a current collector, collecting the current obtained from the solar cell.

For example, the conductive support layer may comprise a material selected from indium doped tin oxide (ITO), fluorine doped tinoxide (FTO), ZnO—$Ga_2O_3$, ZnO—$Al_2O_3$, tin-oxide, antimony doped tin oxide (ATO), $SrGeO_3$ and zinc oxide, preferably coated on a transparent substrate, such as plastic or glass.

The current collector may also be provided by a conductive metal foil, such as a titanium or zinc foil, for example. Non-transparent conductive materials may be used as current collectors in particular on the side of the device that is not exposed to the light to be captured by the device.

According to an embodiment, a surface-increasing scaffold structure is provided on said conducting support structure or on a protective layer that may be provided on said scaffold structure. The scaffold material may be made from any one or combinations selected from of a large variety of different materials consisting essentially of or is made from one selected from the group consisting of a semiconductor material, a conducting material, a non-conducting material and combinations of two or more of the aforementioned.

According to an embodiment, said scaffold structure comprises a metal oxide. The material of the scaffold structure is selected from semiconducting materials, such as Si, $TiO_2$, $SnO_2$, $Fe_2O_3$, ZnO, $WO_3$, $Nb_2O_5$, CdS, ZnS, PbS, $Bi_2S_3$, CdSe, CdTe, $SrTiO_3$, GaP, InP, GaAs, $CuInS_2$, $CuInSe_2$, and combinations thereof, for example. Preferred semiconductor materials are Si, $TiO_2$, $SnO_2$, ZnO, $WO_3$, $Nb_2O_5$ and $SrTiO_3$.

The scaffold structure may comprise non-conducting material, i.e. plastics, plastic nanoparticles (Polystyrene (PS)) spheres of sub-micrometer.

By "hole transport material", "hole transporting material", "organic hole transport material" and "inorganic hole transport material", and the like, is meant any material or composition wherein charges are transported by electron or hole movement (electronic motion) across said material or composition. The "hole transport material" is thus an electrically conductive material. Such hole transport materials, etc., are different from electrolytes. In this latter, charges are transported by diffusion of molecules.

Hole transport material may be preferably selected from organic and inorganic hole transport materials.

According to an embodiment, the hole transport material is selected from triphenylamine, carbazole, N,N,(diphenyl)-N',N'di-(alkylphenyl)-4,4'-biphenyldiamine, (pTPDs), diphenylhydrazone, poly [N,N'-bis(4-butylphenyl)-N,N'-bis (phenyl)benzidine] (polyTPD), polyTPD substituted by electron donor groups and/or acceptor groups, poly(9,9-dioctylfluorene-alt-N-(4-butylphenyl)-diphenylamine (TFB), 2,2',7,7'-tetrakis-N,N-di-p-methoxyphenylamine-9, 9'-spirobifluorene) (spiro-OMeTAD), N,N,N',N'-tetraphenylbenzidine (TPD), PTAA (Poly[bis(4-phenyl)(2,4,6-trimethylphenyl)amine]).

Further ionic compounds may be present in organic hole transport materials, said ionic compounds being selected from $TBAPF_6$, Na $CF_3SO_3$, Li $CF_3SO_3$, $LiClO_4$ and $Li[(CF_3SO_2)_2N$. Other compounds that may be present in organic hole transport materials are amines, 4-tertbutylpyridine, 4-nonyl-pyrdine, imidazole, N-methyl benzimidazole, for example.

Hole transport material may be also inorganic hole transport materials. A wide variety of inorganic hole transport materials is commercially available. Non-limiting examples of inorganic hole transport materials are Cu2O, CuNCS, CuI, MoO3, and WoO3.

The solid state solar cell may comprise a protective layer as being an optional layer. This protective layer may be a metal oxide layer comprising a material selected from Mg-oxide. Hf-oxide, Ga-oxide, In-oxide, Nb-oxide, Ti-oxide, Ta-oxide, Y-oxide and Zr-oxide. This layer may have a thickness of not more than 1.5 nm, preferably not more than 1 nm. Said metal oxide layer is in particular "buffer layer, which reduces or prevents recombination of photo generated electrons with the perovskite material, for example. Said optional layer may comprises Cr and be provided between hole transport material layer and the counter electrode.

The solar cell of the invention preferably comprises a counter electrode. The counter electrode generally comprises a catalytically active material, suitable to provide electrons and/or fill holes towards the inside of the device. The counter electrode may thus comprise one or more materials selected from Pt, Au, Ni, Cu, Ag, In, Ru, Pd, Rh, Ir, Os, C, conductive polymer and a combination of two or more of the aforementioned. Conductive polymers may be selected from polymers comprising polyaniline, polypyrrole, polythiophene, polybenzene, polyyethylenedioxythiophene, polypropylenedioxy-thiophene, polyacetylene, and combinations of two or more of the aforementioned, for example.

The counter electrode may be applied by thermal evaporation of the counter electrode material onto the perovskite layer.

The counter electrode is preferably connected to a current collector, which is then is connected to the external circuit, as the conductive support on the other, opposed side of the device. As on the opposed side of the device, a conductive support such as conductive glass or plastic may be electrically connected to the counter electrode. In this case, the device has two opposed support or protective layers, which encase the solar cell, for example.

According to an embodiment, said counter electrode and/or metal layer is in direct contact with said perovskite layer and/or not separated by any further layer or medium from said perovskite layer. However, this does not exclude the possibility of a metal oxide protective layer, which may be provided between said counter electrode and said perovskite layer, as specified elsewhere in this specification.

The invention also provides a method for preparing a solid state solar cell comprising:
- providing a conductive support layer covered by a surface-increasing scaffold structure or mesoporous structure;
- providing one or more organic-inorganic perovskite layers comprising the perovskite material of the invention as defined herein;
- providing a counter electrode.

Said one or more organic-inorganic perovskite layers form the thin film of the perovskite material of the invention, said thin film being obtained after the spin-coating of the perovskite material of the invention on the mesoporous structure of the conductive support layer, which may be covered by an optional protective layer, and the annealing of said of said one or more perovskite material layers.

The method of preparing a solid state of the invention may further comprise steps of providing a hole transporting layer on the one or more organic-inorganic perovskite layers.

The method of the invention comprises the step of applying one or more organic-inorganic perovskite layers on said scaffold structure or mesoporous structure. The perovskite layer may be applied by any suitable process. According to an embodiment, the one or more perovskite layers are applied by any one or a combination of drop costing, spin-coating, dip-coating and spray-coating, preferably spin-coating.

The present invention will now be illustrated by way of examples. These examples do not limit the scope of this invention, which is defined by the appended claims.

EXAMPLES

Solid State Solar Cell Preparation
Substrate Preparation and Li-Doping TiO$_2$

Nippon Sheet Glass 10 Ω/sq was cleaned by sonication in 2% Hellmanex water solution for 30 min. After rinsing with deionised water and ethanol, the substrates were further cleaned with UV ozone treatment for 15 min. Then, 30 nm TiO$_2$ compact layer was deposited on FTO via spray pyrolysis at 450° C. from a precursor solution of titanium diisopropoxide bis-(acctylacetonate) in anhydrous ethanol. After the spraying, the substrates were left at 450° C. for 45 min and left to cool down to room temperature. Then, a mesoporous TiO$_2$ layer was deposited by spin coating for 20 s at 4000 rpm (418.88 rad/s) with a ramp of 2000 rpm s$^{-1}$ (209.44 rad/s$^2$), using a 30 nm particle paste (Dyesol 30 NR-D) diluted in ethanol to achieve 150-200 nm thick layer. After the spin coating, the substrates were dried at 100° C. for 10 min and then sintered again at 450° C. for 30 min under dry air flow.

Li-doping of mesoporous TiO$_2$ (Nat Commun, 2016, 7, 10379), 1 is accomplished by spin coating a 0.1 M solution of Li-TFSI in acetonitrile at 3000 rpm (314.16 rad/s) for 10 s followed by another sintering step at 450° C. for 30 min. After cooling down to 150° C. the substrates were immediately transferred in a nitrogen atmosphere glove box (MBraun with pressure varying from 5-6 mbar) for depositing the perovskite films.

Hole Transporting Layer and Top Electrode

After the perovskite annealing, the substrates were cooled down for few minutes and a spiro-OMeTAD (Merck) solution or a PTAA solution was spin coated at 4000 rpm (418.88 rad/s) for 20 s. Spiro-OMeTAD was doped with bis(trifluoromethylsulfonyl)imide lithium salt (Li-TFSI, Sigma-Aldrich), tris(2-(1H-pyrazol-1-yl)-4-tert-butylpyridine)-cobalt (III) tris(bis(trifluoromethylsulfonyl)imide) (FK209, Dynamo) and 4-tert-Butylpyridine (TBP), Sigma-Aldrich). The molar ratio of additives for spiro-OMeTAD was: 0.5, 0.03 and 3.3 for Li-TFSI, FK209 and TBP respectively. Finally, 70-80 nm of gold top electrode was thermally evaporated under high vacuum.

Perovskite Precursor Solution and Film preparation of a Perovskite Material of the Invention RbCsFAMAPbBr$_2$I Synthesis: Perovskite Precursor Solution The organic cations were purchased from Dyesol; the lead compounds from TCI; CsI and RbI from aber GmbH. The "mixed" perovskite precursor solutions were obtained from a precursor solution containing FAI (1 M), PbI$_2$ (1.1 M), MABr (0.2 M) and PbBr$_2$ (0.2 M) in anhydrous DMF: DMSO 4:1 (v:v). Then CsI and RbI, predissolved as a 1.5 M stock solution in DMSO, were added to the mixed perovskite precursor to achieve the desired quadruple cation composition.

Preparation of Film of RbCsFAMAPbBr$_2$I

The perovskite solution was spin coated on the above mentioned substrate in a two steps program at 1000 and 6000 rpm (at 104.72 and 628.32 rad/s) for 10 and 20 s respectively. During the second step, 100 μl of chlorobenzene was poured on the spinning substrate 5 s prior to the end of the program. The substrates were then annealed (usually at 100° C.) for 1 h in a nitrogen filled glove box.

Photovoltaic Devices

Crystallization of the Perovskite Thin Film

Starting conditions of the crystallisation process for thin films of organic cations perovskite (MA$_g$FA$_h$)Pb(I$_{0.83}$Br$_{0.17}$)$_3$ (MAFA) or of quadruple mixed organic-inorganic cations perovskite Rb$_b$Cs$_a$(MA$_g$FA$_h$)$_{(1-a-b)}$Pb(I$_{0.83}$Br$_{0.17}$)$_3$ (RbCsMAFA) before annealing step at 100° C. were investigated (the step of annealing is necessary to fully crystallize the perovskite films). By recording the UV-vis and photoluminescence (PL) data of the unannealed MAFA and RbCsMAFA films, it was shown mat MAFA shows several PL peaks with maxima ranging from 670-790 nm, while the RbCsMAFA film has a distinct, narrow peak at 770 nm which is attributable to perovskite. The fluorescence microscopy maps of the surface to the unannealed films further show that the unannealed film of MAFA is comprised of different emissive species showing that the pre-annealed film crystallises with inhomogeneous starting conditions, contrary to the unannealed films of RbCsMAFA, which are emissive in a narrow range and thus start crystallizing at more homogenous conditions. The reveals that the addition of inorganic cations "normalizes" the crystallisation which now starts with a photoactive perovskite phase instead of multiple non-perovskite species. The recording data of UV-vis and photoluminescence measurements after the annealing reveal a RbCsMAFA band gap of ~1.63 eV (which is slightly shifted compared to MAFA) and neither lead excess nor yellow phase impurities. This reveals that cation Rb$^+$ modifies the crystal lattice. Hence, the film formation properties of RbCsMAFA are indeed particularly promising for obtaining high purity materials.

SEM Pictures of Thin Films of Triple or Quadruple Mixed Organic-Inorganic Perovskites Photovoltaic devices comprising quadruple mixed organic-inorganic cations halide perovskites were fabricated according to the method of the invention. For comparison photovoltaic devices comprising triple mixed organic-inorganic cations halide perovskites $(Cs_a(MA_gFA_h)_{(1-a)}Pb(I_{0.83}Br_{0.17})_3)$ (CsMAFA) were also tested and their photovoltaic parameters were measured.

Photovoltaic devices with quadruple cations perovskites thin film show larger crystal size growth by SEM (Scanning Electron Microscopy) than photovoltaic devices with triple cations perovskites thin film (see FIGS. 1A, B, C and D). It seems that the addition of the inorganic cation Ai being $Rb^+$ into the triple cation perovskite containing Cs (CsMAFA) likely works as a seed for crystallization of the perovskite. Further by increasing the ratio of the inorganic cation $Rb^+$ in the mixed organic-inorganic cations of the quadruple cations perovskite (RbCsMAFA), more the crystal size grows and crystal "grains" larger than crystal grains from triple mixed organic-inorganic cations perovskite are obtained. The addition of K+ or Na+ in said triple mixed organic-inorganic perovskites has not the same effect on the crystallization process. The crystal size growth seems to be unaffected.

Photovoltaic Parameters Measurements

The solar cells were measured using a 450 W xenon light source (Oriel). The spectral mismatch between AM1.5G and the simulated illumination was reduced by the use of a Schott K113 Tempax filter (Präzisions Glas & Optik GmbH). The light intensity was calibrated with a Si photodiode equipped with an IR-cutoff filter (KG3, Schott), and it was recorded during each measurement. Current-voltage characteristics of the cells were obtained by applying an external voltage bias while measuring the current response with a digital source meter (Keithley 2400). The usual voltage scan rate was at 10 mV s−1 (slow) and no device preconditioning, such as light soaking or forward voltage bias applied for long time, was applied before starting the measurement. The starting voltage was determined as the potential at which the cells furnish 1 mA in forward bias; no equilibration time was used. The cells were masked with a black metal mask (0.16 $cm^2$) to fix the active area and reduce the influence of the scattered light. For the record device, the light source was exposed to simulated standard AM 1.5 sunlight with varying intensities. The photocurrent density was scaled to 1000 W/$m^2$.

Figure 2:
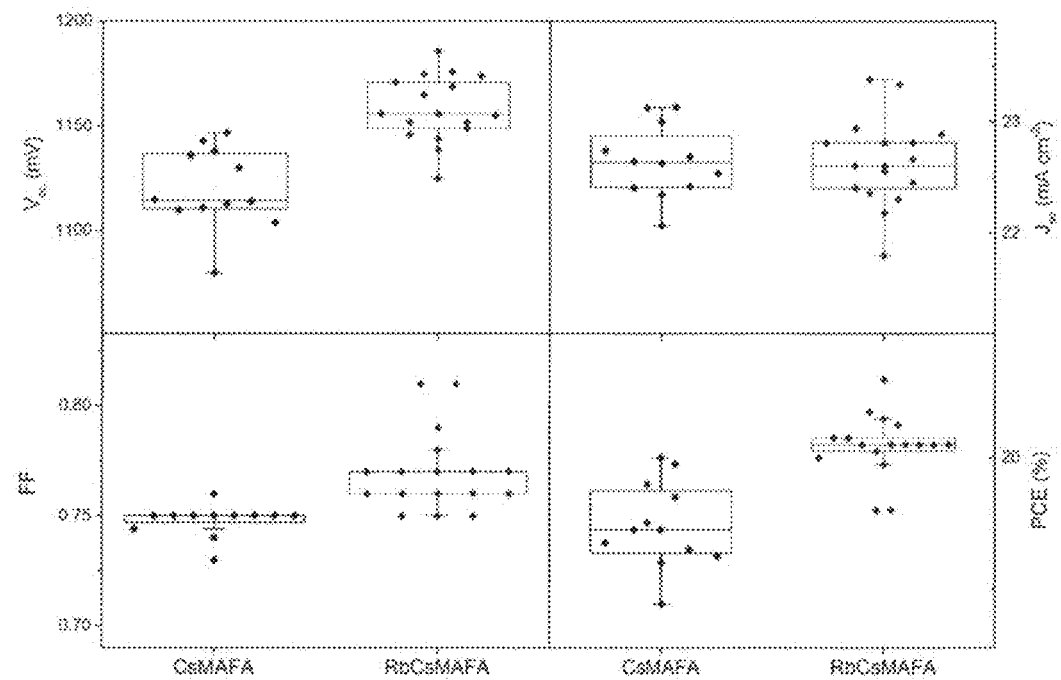
FIG. 2 shows graphical records of photoelectron-conversion efficiency (PCE) and photovoltaic parameters of different batches of PV devices having either triple mixed organic-inorganic cations perovskites $CsMAFAPbBr_{0.17} I_{0.83}$ (CsMAFA) or quadruple mixed organic-inorganic cations perovskites $RbCsMAFAPbBr_{0.17}I_{0.83}$ (RbCsMAFA) without submitting them to aging process but measuring photovoltaic parameters one day after being prepared.

The photovoltaic parameters were measured for each type of above-mentioned photovoltaic devices (see FIG. 2) and are resumed in Table 1.

Figure 3A:
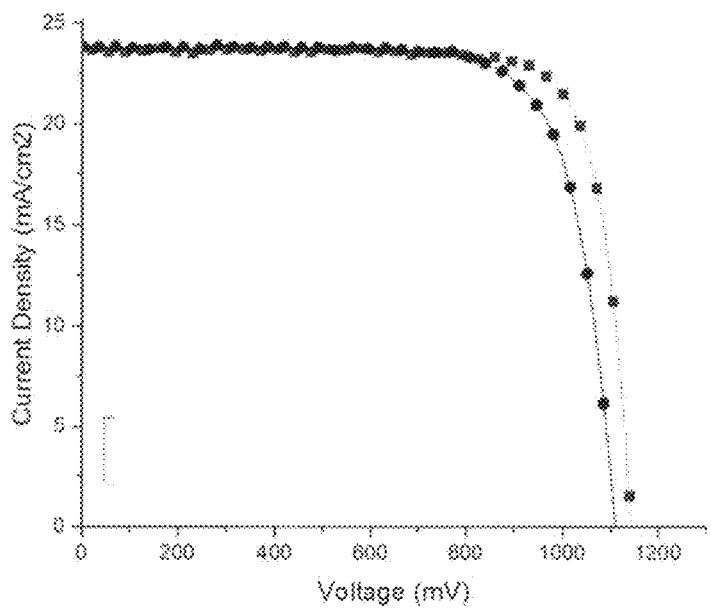
FIG. 3A shows current-density/voltage JV curves of PV devices having either triple mixed organic-inorganic cations perovskites (circles) ($V_{oc}$=1110 mV, $J_{sc}$=23.6 mA/cm$^2$, FF=0.76. PCE=20.1%), or quadruple mixed organic-inorganic cations perovskites (square) $V_{oc}$=1144 mV, $J_{sc}$=23.4 mA/cm$^2$, FF=0.82, PCE=21.9%).
Figure 3:
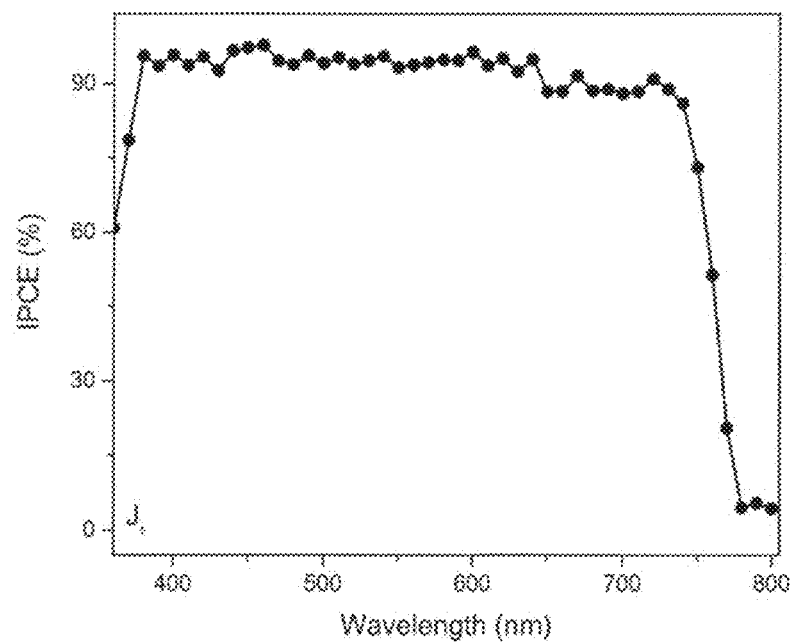
FIG. 3B shows the incident Photon to Current Efficiency (IPCE) of the quadruple mixed organic-inorganic cations perovskite RbCsMAFA PV device having a PCE of 21.6%. FF being 81% and $V_{oc}$ of 1180 mV. The integrated short circuit current density follows closely the JV scans from the solar simulator.
Figure 5:
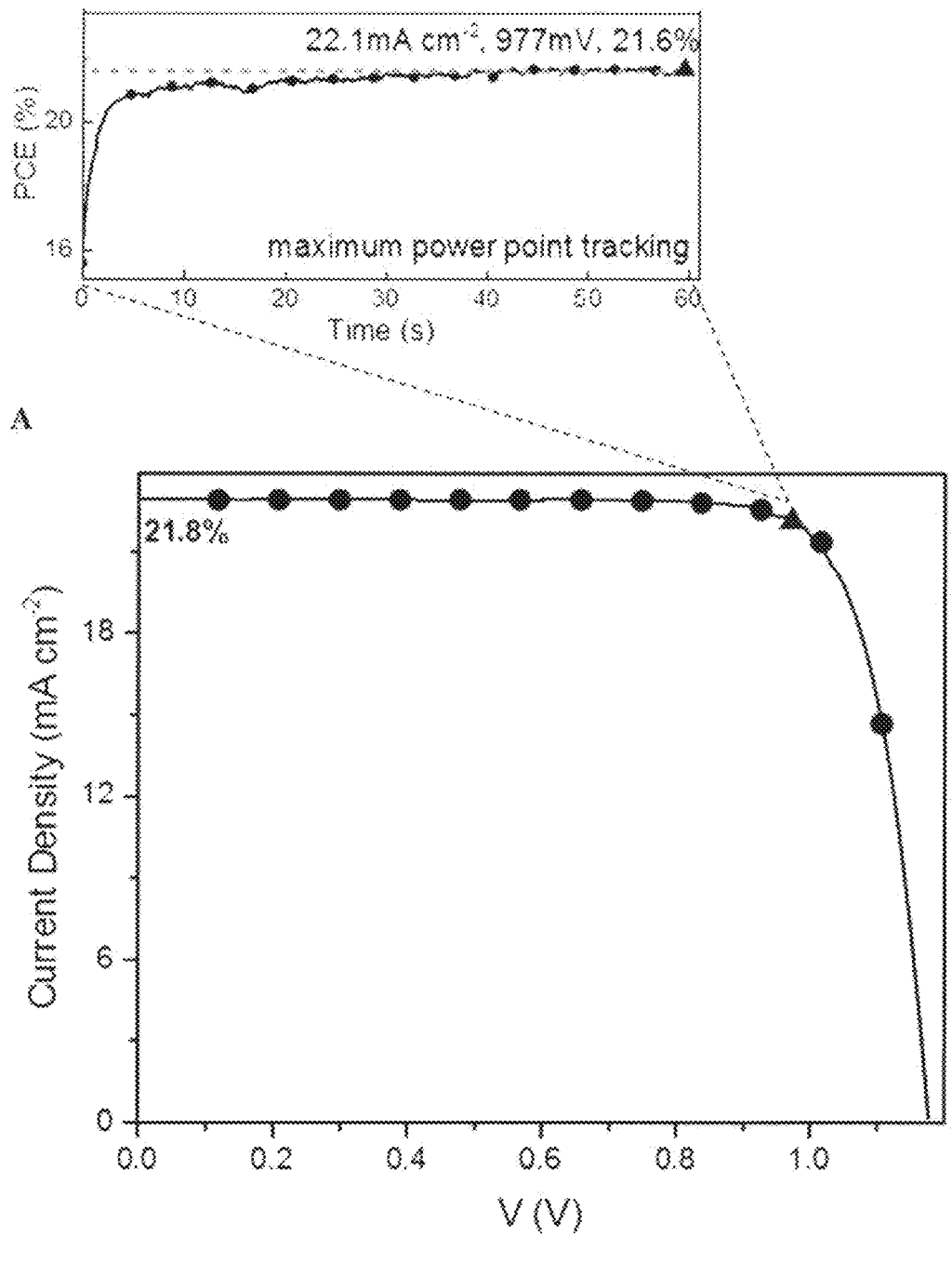
FIG. 5 shows current-density/voltage (JV) curve of the best performing solar cell with 21.8% efficiency and taken at 10 mV s$^{-1}$ scan rate ($V_{oc}$=1180 mV; $J_{sc}$=22.8 mA cm$^{-2}$ and an exceptional fill factor of 81%) (B). The graphic in (A) displays the scan rate independent maximum power point (MPP) tracking for 60 s resulting in a maximum power output of 21.6% at 977 mV voltage and a current density of 22.1 mA·cm$^{-2}$ (shown as triangles in the JV and MPP scan, respectively).

Compared with PV devices having the triple mixed organic-inorganic cations perovskite, the average open-circuit voltage ($V_{oc}$) of PV devices having the quadruple mixed organic-inorganic cations perovskite is remarkably increased from 1120 to 1158 mV and the fill factor from 0.75 to 0.78. In FIG. 5B, we show a PV device having the quadruple mixed organic-inorganic cations perovskite RbCsMAFA PV device reaches 21.6% PCE, one of the highest stabilized power output, with an exceptionally high fill factor of 81% and 1180 mV open-circuit voltage. The measured $J_{sc}$ (22.65 mA·$cm^{-2}$) closely follows the measured incident-photon-to-current-efficiency (IPCE) in FIG. 3B.

Figure 4:
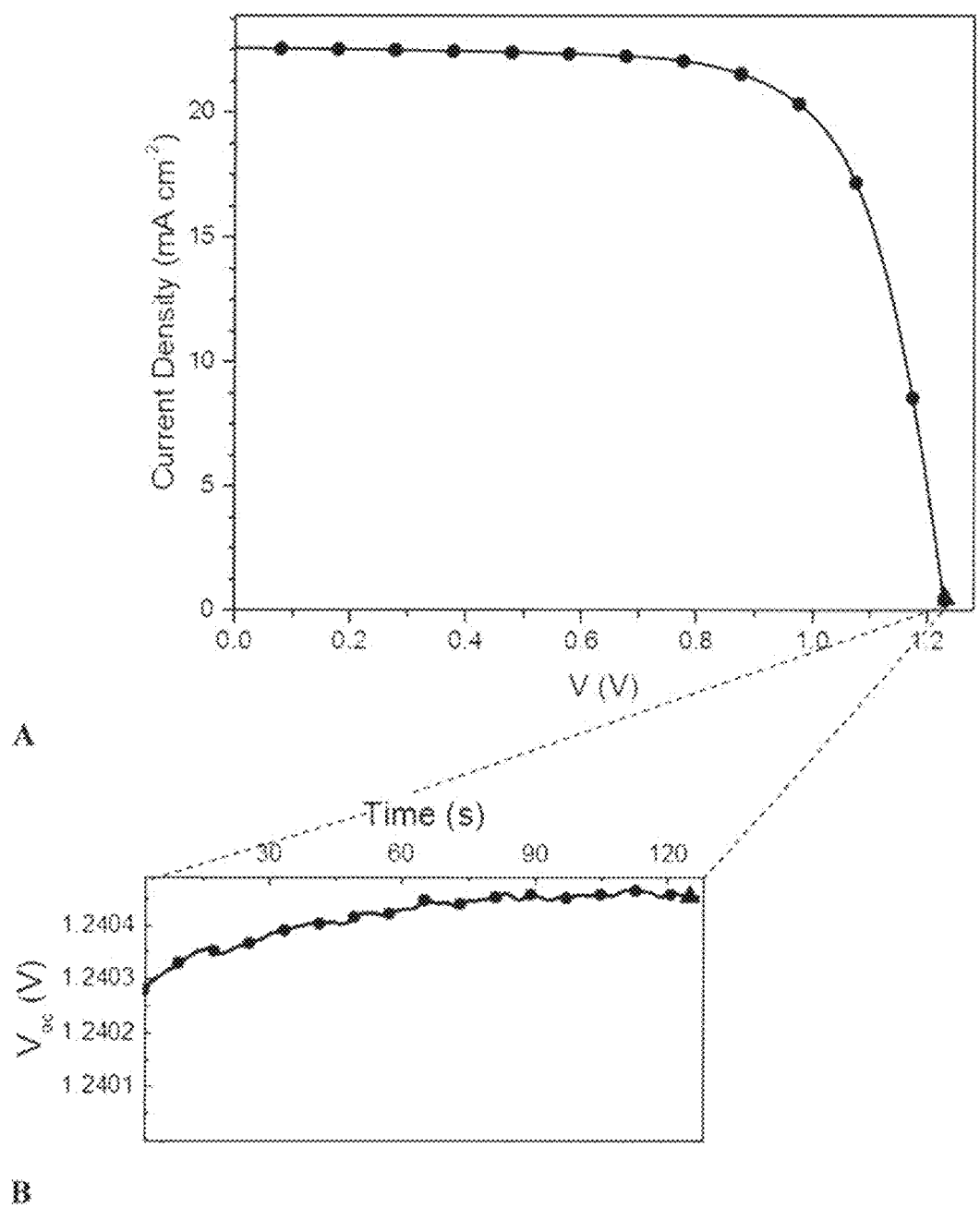
FIG. 4 shows current-density/voltage (JV) one of the highest open-circuit voltage device, taken at 10 mV s$^{-1}$ scan rate (A). The graphic in (B) displays the open circuit voltage over 120 s resulting in 1240 mV (shown as triangles in the JV and $V_{oc}$ scan, respectively).

In order to fully assess if our material has novel properties, we have investigated RbCsMAFA PV devices without a mask (to prevent dark leakage), held at room temperature and under an inert nitrogen atmosphere. This provides an accurate $V_{oc}$ value without degradation effects. In FIG. 4A, for one of our highest performing devices, we measure an astonishing $V_{oc}$ of 1240 mV confirmed by the inset that is tracking the $V_{oc}$ over time. The "loss-in-potential" (difference between $V_{oc}$ and band gap) is only ~0.39 V implying very low recombination losses.

Figure 6A:
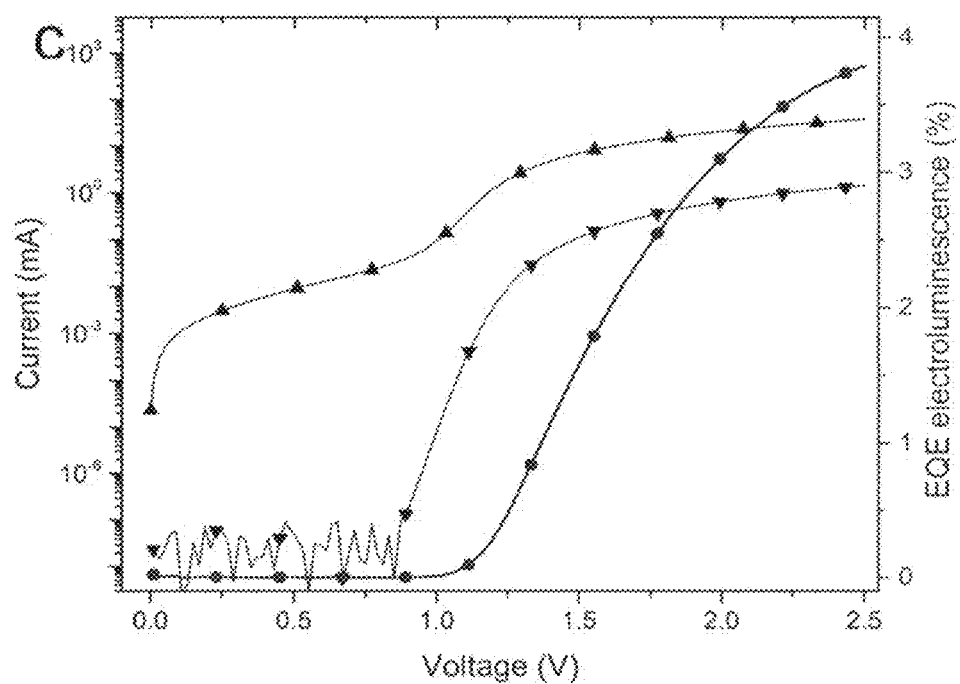
FIG. 6A shows the electroluminescence curve of an optoelectronic and/or photoelectrochemical device of the invention. Voltage is applied to the device and the resulting current is represented by the curve with up-facing triangles. In response, the device starts to emit, said emission being recorded by a photodiode (down-facing triangle). The resulting electroluminescence is then calculated as the ratio between the device and photodiode current (circles).

Electroluminescence $V_{oc}$ and electroluminescence measurements were performed using the above LED setup. The devices were left unmasked, at room temperature and under constant nitrogen flow in order to prevent degradation during operation. $V_{oc}$ tracking was performed by applying 0 µA current on the device and recording the voltage. Electroluminescence yield was measured by applying either constant current or by applying varying potential to the device and by recording the emitted photon flux with a calibrated, large area (1 $cm^{-2}$) Si photodiode (Hamamatsu S1227-1010BQ) placed directly on top of the sample. The driving voltage or current were applied using a Bio-Logic SP300 potentiostat, which was also used to measure the short-circuit current of the detector at a second channel (see FIGS. 6A and 6B).

Thus the EL is measured on a quadruple mixed organic-inorganic cations perovskite solar cell with 2 active areas. The left area is operated as an LED displaying a clearly visible emission even under ambient light. At the same time, the right area can be operated as a solar cell or a photodetector underlining the versatility of the perovskite material.

Figure 6B:
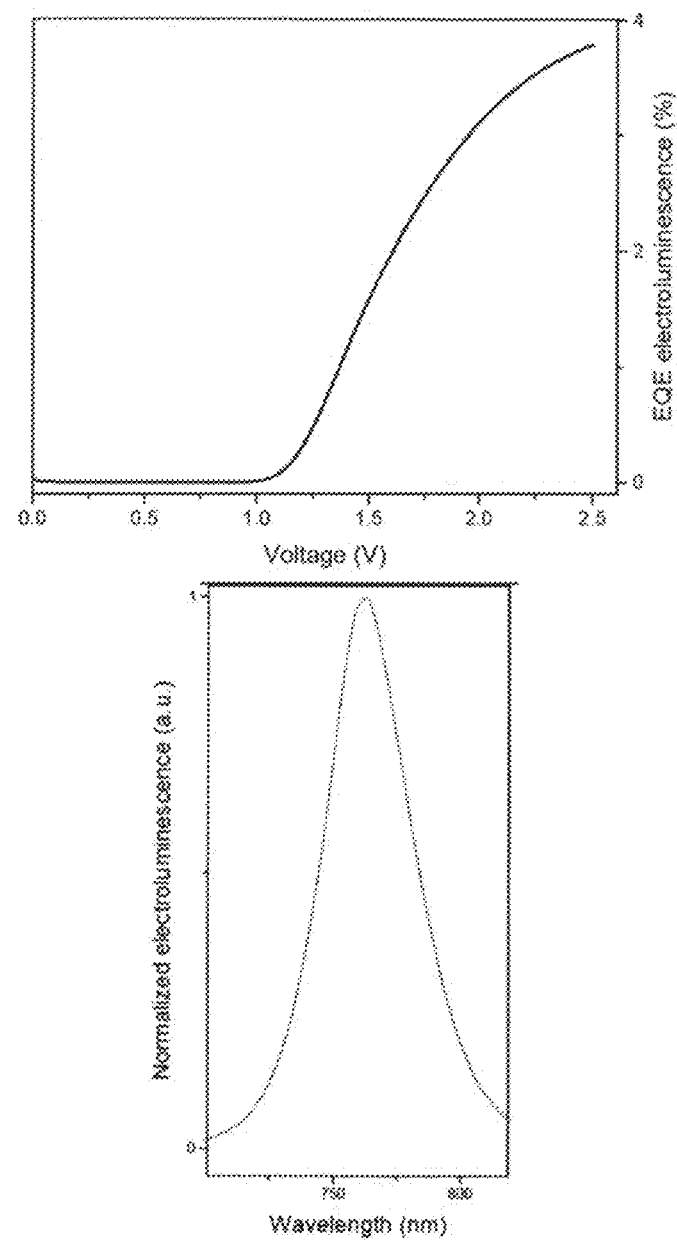
FIG. 6B shows EQE electroluminescence (EL) as a function of voltage (left graphic). The right graphic shows the corresponding EL spectrum over wavelength.

In FIG. 6B, we show the calculated $EQE_{EL}$ (external quantum efficiency of electroluminescence) as a function of voltage (along with an electroluminescence spectrum showing a band gap of ~1.63 eV) with an emission that can be detected from ~900 mV. The $EQE_{EL}$ to match the following equation:

$$V_{oc} = V_{oc,rad} - \Delta V_{oc,nonrad} =$$
$$V_{oc,rad} - \frac{kT}{e} \ln EQE_{EL} \approx V_{oc,rad} - 60 \text{ mV} \log EQE_{EL} |_{y=300 K}$$

is chosen such that the injection current equals the photocurrent of ~22 mA $cm^{-2}$. We measure an $EQE_{EL}$ of 1.4% resulting in a predicted $V_{oc}$ of 1240 mV complementing the value measured from the JV curve. The $EQE_{EL}$ approaches 4% for higher driving currents, making the solar cell one of the most efficient perovskite LEDs as well, emitting in the near IR/red spectral range (see FIG. 6B, right graphic). This is particularly remarkable as efficient LEDs commonly require architectures including thin active layers, which are not suited for efficient light harvesting in solar cells. Our $EQE_{EL}$ is larger than for any commercially available solar cell (e.g. for Si $EQE_{EL} \approx 0.5\%$) (except for the industrially optimized thin film GaAs solar cells from Alta devices that contains specialized reflecting rear mirror designs). This indicates that all sources of non-radiative recombination are strongly suppressed and the material is almost bulk and surface defect free.

Stability Measurements

Stability measurements were performed with a Biologic MPG2 potentiostat under a 1 Sun-equivalent white LED lamp. The devices welt masked (0.16 $cm^2$) and flushed with nitrogen for several hours be tore the start of the experiment in order to remove residual oxygen and water from the environment of an in-house developed sample holder. Then, the devices were measured with a maximum power point (MPP) tracking routine under continuous illumination (and nitrogen). The MPP was updated every 10 s by a standard perturb and observe method, the temperature of the devices was controlled with a Peltier element in direct contact with the films. The temperature was measured with a surface thermometer located between the Peltier element and the film. Every 60 minutes a JV curve was recorded in order to trick the evolution of individual JV parameters.

Figure 7:
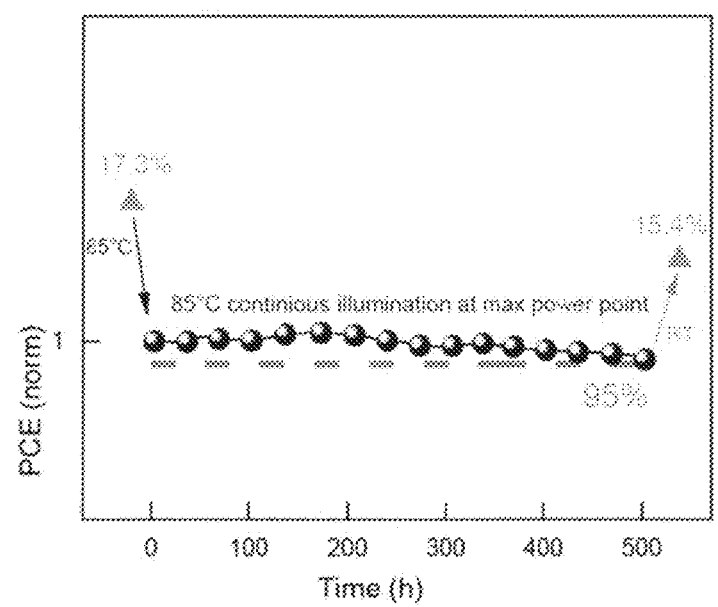
FIG. 7 shows the thermal stability test of a quadruple mixed organic-inorganic cation perovskite solar cell. The device is aged for 500 hours at 85° C. under continuous illumination and maximum power point tracking in a nitrogen atmosphere (circles curve). The room temperature (RT) efficiencies before (17.3%) and after aging (15.45) are indicated above the triangles.

The device is aged for 500 hours at 85° C. under continuous illumination and maximum power point tracking in a nitrogen atmosphere (see FIG. 7). This aging routine exceeds most industry norms. During the 85° C. step, the device retains 95% of its initial performance.

With efficiencies close to 22% and a remarkable EL, this perovskite material has the potential to be highly attractive for industry. It already outcompetes most other PV materials and could go very plausibly towards 25% if all the best performing parameters were realized on one device.

However, to make a real impact, the next mandatory breakthrough must be in the area of long-term stability. Interestingly, as we discovered recently, besides the hygroscopic nature of perovskite films, phase instabilities and light sensitivity, a further major concern for the long-term stability is the commonly used spiro-OMeTAD hole transporter material (HTM) that becomes permeable (at elevated temperature) to metal electrode diffusion into the perovskite causing irreversible degradation. This is the underlying reason most stability testing at higher temperature has been unsuccessful so far. We found that a Cr buffer layer between gold and spiro-OMeTAD can partially mitigate the metal migration. This result is in line with MeGehee and co-workers (K. A. Bush et al. Adv Mater, 2016) who use a μm thick ITO encapsulation layer without any gold contacts. However, introducing additional or very thick protective layers is laborious, expensive and often entails recombination losses that are detrimental to the overall device operation.

In this work, we present a simple way to prevent the gold diffusion into the perovskite; we replace spiro-OMeTAD with the polymeric PTAA (Poly[bis(4-phenyl)(2,4,6-trimethylphenyl)amine]) Hole Transporting Material (HTM) (Heo et al., Nat Photonics 7, 487, 2013). Surprisingly, even a thin (~50 nm) of PTAA is sufficiently dense and stable, even at high temperatures, to protect the perovskite from gold migration. Therefore, we refer to the PTAA devices as the "stability architecture" enabling high temperature stability testing. We note this result indicates that polymeric HTMs may be the breakthrough needed to finally realize high temperature stable PV devices.

In this work, we impose the above aging protocols simultaneously aging devices for 500 hours at 85° C. under continuous illumination and maximum power point tracking in a nitrogen atmosphere. This stress test exceeds industrial standards. We show the result in FIG. 7 (circles curve) together with the room temperature (RT) efficiencies before and after aging (over the triangles). During the 85° C. step, the device retains 95% of its initial performance. To our knowledge, this one of the industrially most relevant report on PSC stability to date providing concrete evidence that the Rb compositions reported here have the realistic potential to pass the "softer" industrial aging protocols.

We also hypothesize that increasing the perovskite complexity in general can be extended beyond the multiple cation approach to stabilize for example mixed metal compounds. So far, Sn/Pb compositions are oxidation unstable. Using multiple cations and metals, however, could stabilize this compound. This would provide band gaps at the single junction optimum of ~1.4 eV or even towards 1.1 eV where perovskites could replace silicon PVs, thus contributing towards the vision of perovskite-on-perovskite tandem or even multifunction perovskite solar cells.

Considering the high $V_{oc}$ and electroluminescence, this approach could enable a new generation of highly emissive perovskites for photovoltaics and photoemission applications (lasers and light emitting device (LEDs)).

The invention claimed is:

1. A perovskite material essentially consisting of a three-dimensional organic-inorganic perovskite structure of formula (I)

$$A_nMX_3 \quad (I),$$

wherein
  n is number of cation A and is an integer selected from 4 to 7, all cations being different from each other,
  A is a monovalent cation selected from inorganic cations Ai and from organic cations Ao, wherein
    at least one cation A is selected from organic cations Ao and one or more cations A are selected from inorganic cation Ai being independently selected from $Li^+$, $Na^+$, $K^+$, $Rb^+$, or $Cs^+$,
    at least two cations A are inorganic cations Ai being $Rb^+$ and $Cs^+$, and
    the organic cations Ao are independently selected from ammonium ($NH_4^+$), methyl ammonium (MA) ($CH_3NH_3^+$), ethyl ammonium ($CH_3CH_2NH_3$)$^+$, formamidinium (FA) ($CH(NH_2)_2^+$), methylformamidinium ($CH_3C(NH_2)_2^+$), guanidinium ($C((NH_2)_3^+$), tetramethylammonium ($(CH_3)_4N^+$), dimethylammonium ($(CH_3)_2NH_2^+$) or trimethylammonium ($(CH_3)_3NH^+$);
  M is selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, $Yb^{2+}$ or a combination thereof; and
  X is an anion independently selected from $Br^-$, $I^-$, $Cl^-$, $SCN^-$, $CN^-$, $NC^-$, $OCN^-$, $NCO^-$, $NCS^-$, $SeCN^-$, $TeCN^-$, $PF_6^-$, $BF_4^-$ or a combination thereof.

2. The perovskite material according to claim 1, wherein the at least one cation A being selected from organic cation Ao is selected from formamidinium or methyl ammonium.

3. The perovskite material according to claim 1, wherein one cation A is an organic cation Ao being formamidinium and a second cation A is an organic cation Ao being methylammonium.

4. The perovskite material according to claim 1, wherein n is 4, two cations A are inorganic cations Ai being $Rb^+$ and $Cs^+$ and one cation A is an organic cation Ao being formamidinium and a second cation A is an organic cation Ao being methylammonium.

5. The perovskite material according to claim 1, wherein M is selected $Ge^{2+}$, $Sn^{2+}$ or $Pb^{2+}$ or a combination thereof.

6. The perovskite material according to claim 1, wherein the organic-inorganic perovskite structure of formula (I) is selected from an organic-inorganic perovskite structure of formula (II), $$Ai_aAi_bAi_cAi_dAi_eAi_f(Ao_gAo_h)_jMX_3 \quad (II),$$

wherein
  a, b, c, d, e, f are ratios of inorganic cations Ai, and g and h are ratios of organic cation Ao,
  j is the ratio of organic cation $Ao_gAo_h$,
  a, b, c, d, e, f are ≥0.00 and <1.00, and 0.00<(a+b+c+d+e+f)<1.00,
  h=1.00−g, and 0.00<g≤1.00,
  j=1.00−(a+b+c+d+e+f), and 0.00<j<1.00, and
  Ai is an inorganic cation as defined in claim 1 and Ao is an organic cation as defined in claim 1;

M is a divalent metal cation as defined in claim 1 and X is a halide and/or pseudohalide anion as defined in claim 1;

with the proviso that 3, 4, 5, or 6 inorganic cations Ai being selected from $Ai_a Ai_b Ai_c Ai_d Ai_e$ or $Ai_f$ have a ratio a, b, c, d, e or f being >0.00 if h is 0.00, and that 2, 3, 4, or 5 inorganic cations Ai being selected from $Ai_a Ai_b Ai_c Ai_d A_e$ or $Ai_f$ have a ratio a, b, c, d, e or f being >0.00, if h is >0.00; and wherein one inorganic cations Ai being selected from $Ai_a Ai_b Ai_c Ai_d Ai_e$ or $Ai_f$, having a ratio a, b, c, d, e or f being >0.00 is Rb$^+$ and one inorganic cations Ai being selected from $Ai_a\ Ai_b Ai_c Ai_d A_e$ or $Ai_f$, having a ratio a, b, c, d, e or f being >0.00 is Cs$^+$.

7. The perovskite material according to claim 6, wherein one of the organic cations Ao$_g$ or Ao$_h$ is methylammonium and the other organic cation is formamidinium, h being >0.00.

8. The perovskite material according to claim 6, wherein, if h is 0.00, at least three inorganic cations Ai being selected from $Ai_a Ai_b A_c Ai_d Ai_e$ or $Ai_f$ have a ratio a, b, c, d, e or f being >0.00.

9. The perovskite material according to claim 6, wherein, if h >0.00, at least two inorganic cations Ai selected from $Ai_a Ai_b Ai_c Ai_d Ai_e$ or $Ai_f$ of the organic-inorganic perovskite of formula (II) have a ratio a, b, c, d, e or f being >0.00.

10. The perovskite material according to claim 6, wherein two inorganic cations Ai being selected from $Ai_a Ai_b Ai_c Ai_d Ai_e$ or $Ai_f$ have a ratio a, b, c, d, e or f being >0.00, one inorganic cations Ai being Rb$^+$ and one inorganic cations Ai being Cs$^+$, and wherein one of the organic cations Ao$_g$ or Ao$_h$ is methylammonium and the other organic cation is formamidinium, h being >0.00.

11. An optoelectronic and/or photoelectrochemical device comprising a perovskite material as defined in claim 1.

12. The optoelectronic and/or photoelectrochemical device according to claim 11 is selected from a photovoltaic device being selected from an organic solar cell, a dye sensitized solar cell or a solid state solar cell, from a p-n heterojunction, a phototransistor or OLED (organic light-emitting diode).

13. The optoelectronic and/or photoelectrochemical device according to claim 11 being a solid-state solar cell comprising a conducting support layer covered by a surface-increasing scaffold structure, one or more organic-inorganic perovskite layers comprising said perovskite material, and a counter electrode and/or metal layer.

* * * * *